(12) United States Patent
Jing

(10) Patent No.: US 10,770,668 B2
(45) Date of Patent: Sep. 8, 2020

(54) FLEXIBLE FIBER SUBSTRATE AND FLEXIBLE DISPLAY DEVICE INCLUDING THE SAME

(71) Applicants: HEFEI XINSHENG OPTOELECTRONICS TECHNOLOGY CO., LTD., Hefei, Anhui (CN); BOE TECHNOLOGY GROUP CO., LTD., Beijing (CN)

(72) Inventor: Yangkun Jing, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/406,648

(22) Filed: May 8, 2019

(65) Prior Publication Data
US 2020/0075873 A1 Mar. 5, 2020

(30) Foreign Application Priority Data

Aug. 29, 2018 (CN) .......................... 2018 1 0995743

(51) Int. Cl.
*H01L 51/00* (2006.01)
*G09F 9/30* (2006.01)
*H05K 1/03* (2006.01)

(52) U.S. Cl.
CPC .......... *H01L 51/0097* (2013.01); *G09F 9/301* (2013.01); *H05K 1/0393* (2013.01)

(58) Field of Classification Search
CPC .... H01L 51/0097; H05K 1/0393; G09F 9/301
See application file for complete search history.

(56) References Cited

U.S. PATENT DOCUMENTS

| | | | | |
|---|---|---|---|---|
| 4,543,295 | A * | 9/1985 | St. Clair | B32B 27/34 156/307.7 |
| 9,974,170 | B1 * | 5/2018 | Sunshine | C23C 18/1633 |
| 2003/0006693 | A1 * | 1/2003 | Topelberg | H05B 33/12 313/483 |
| 2003/0090200 | A1 * | 5/2003 | Topelberg | H05B 33/26 313/511 |
| 2007/0190881 | A1 * | 8/2007 | Shibaoka | D03D 1/0088 442/228 |
| 2009/0153542 | A1 * | 6/2009 | Arneson | G02B 5/02 345/214 |
| 2013/0161684 | A1 * | 6/2013 | Momma | H01L 33/52 257/100 |
| 2013/0278624 | A1 * | 10/2013 | Abe | G09G 5/363 345/619 |
| 2015/0153862 | A1 * | 6/2015 | Nakamura | G06F 3/041 345/173 |
| 2016/0267835 | A1 * | 9/2016 | Meersman | G09G 3/32 |

FOREIGN PATENT DOCUMENTS

CN 107177977 * 9/2017 ............. H01L 51/00

* cited by examiner

*Primary Examiner* — Donald L Raleigh

(57) ABSTRACT

A flexible fiber substrate and a flexible display device including the same are provided. The flexible fiber substrate includes: an insulating body woven from an insulating fiber and a patterned conductive member made of a conductive fiber. The conductive member and the insulating body are fixed to each other by interlacing, and the conductive member is touchable from outside of the flexible fiber substrate.

17 Claims, 3 Drawing Sheets

FLEXIBLE FIBER SUBSTRATE AND FLEXIBLE DISPLAY DEVICE INCLUDING THE SAME

The application claims priority of the Chinese patent application No. 201810995743.5, filed on Aug. 29, 2018, the entire disclosure of which is incorporated herein by reference as part of the present application.

TECHNICAL FIELD

Embodiments of the disclosure relate to a flexible fiber substrate and a flexible display device including the same.

BACKGROUND

Generally, a display technology that can achieve reading comfortably like paper, ultra-thin, light, flexible, and ultra-low power consumption is called the electronic paper technology. The electronic paper display is a paper-like electronic display that possesses the advantages of paper (such as visual perception which is almost completely like paper, so as to avoid reading fatigue), and also can continuously convert and refresh the display content, like a common liquid crystal display, and consume much less power than LCD monitors. The electronic paper display has long been a fantasy that has remained in people's minds, but with a series of breakthroughs of the display technology at the end of the last century, the revolutionary electronic paper display technology has finally begun to go toward the public and practical application.

SUMMARY

An embodiment of the disclosure provides a flexible fiber substrate, comprising: an insulating body woven from an insulating fiber and a patterned conductive member made of a conductive fiber, wherein the conductive member and the insulating body are fixed to each other by interlacing, and the conductive member is touchable from outside of the flexible fiber substrate.

In one example, at least a portion of the conductive member is exposed from a surface of the flexible fiber substrate.

In one example, the flexible fiber substrate has a first outer surface and a second outer surface which are opposite and overlap each other upon being in a substantially flat state, the first outer surface and the second outer surface are substantially located in a first plane and a second plane, respectively; the flexible fiber substrate does not exceed beyond the first plane and the second plane in a direction perpendicular to the flexible fiber substrate in the flat state, at least a portion of the conductive member is located on at least one of the first outer surface and the second outer surface of the flexible fiber substrate.

In one example, the flexible fiber substrate comprises a plurality of woven layers connected to each other and at least partially overlapping each other, the plurality of woven layers comprises a first outermost woven layer, a second outermost woven layer and at least one intermediate woven layer between the first outermost woven layer and the second outermost woven layer, the conductive member comprises a first portion located in the at least one intermediate woven layer, and a portion of the insulating body located in the first outermost woven layer overlaps the first portion of the conductive member.

In one example, the first outermost woven layer has an opening, and the first portion of the conductive member is touchable from the outside of the flexible fiber substrate through the opening.

In one example, the conductive member further comprises a second portion located in the first outermost woven layer, and the second portion of the conductive member is electrically connected to the first portion.

In one example, the conductive fiber comprises a polymeric material and a conductive material dispersed therein.

In one example, the insulating fiber comprises the polymeric material.

In one example, the polymeric material comprises polyamide.

In one example, the conductive material comprises carbon nanotubes.

In one example, a diameter of the insulating fiber is substantially equal to a diameter of the conductive fiber.

In one example, the flexible fiber substrate is configured as a base substrate of a flexible display device, the flexible display device further comprises a display electrode on the base substrate, the conductive member is configured to electrically connect to the display electrode.

The embodiment of the disclosure provides a flexible display device comprising: the flexible fiber substrate according to any one of the above; and a pixel unit on the flexible fiber substrate, comprising a display electrode for displaying an image, wherein the display electrode is electrically connected to the conductive member of the flexible fiber substrate.

In one example, the pixel unit is a pixel unit comprising an electrophoretic microcapsule.

In one example, the display electrode comprises at least one of a pixel electrode and a common electrode.

In one example, the flexible display device further comprises an insulating layer between the display electrode and the flexible fiber substrate, a through hole is located in the insulating layer, and the display electrode is electrically connected to the conductive member of the flexible fiber substrate via the through hole in the insulating layer.

In one example, the insulating layer is a planarization layer having a planar surface far away from the flexible fiber substrate.

In one example, the planarization layer is a polyimide layer.

In one example, the electrophoretic microcapsule has a sectional shape of trapezoid, and a short base of the trapezoid is closer to the flexible fiber substrate relative to a long base of the trapezoid.

In one example, the display electrode is a pixel electrode, the flexible display device further comprises an insulating layer between the display electrode and the flexible fiber substrate, a through hole is located in the insulating layer, and the display electrode is electrically connected to the conductive member of the flexible fiber substrate via the through hole in the insulating layer, the display electrode is located between the insulating layer and the electrophoretic microcapsule.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure and thus are not limitative of the disclosure.

DETAILED DESCRIPTION

Figure 1:
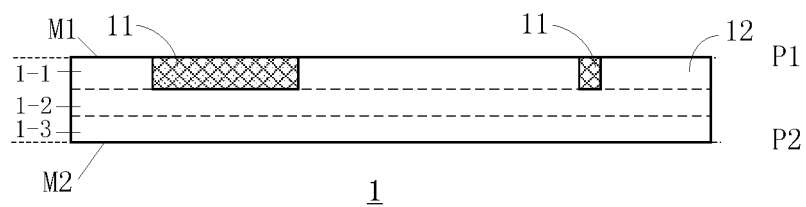
FIG. 1 is a schematic sectional structure view of a flexible fiber substrate according to an embodiment of the disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the disclosure, are not intended to indicate any sequence, amount or importance, but distinguish various components. The terms "comprise," or "include," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly, The display panel of an electronic paper (E-paper) display generally employs an Electrophoresis Display (EPD). What is the electrophoresis technology? Literally, it means "mobility at a certain voltage" and its display operation principle rely on moving the ions in a transparent or colored liquid, i.e. the pixels are brighten or darken by turning or flowing micro-particles, and the micro-particles can be made on glass, metal or plastic substrates. For example, titanium dioxide particles having a diameter of about 1 mm are dispersed in a hydrocarbon oil, and a black dye, a surfactant, and a charge control agent that charges the particles are also added to the hydrocarbon oil; the mixture is placed at two parallel conductive plates with intervals between 10-100 mm, and when the two conductive plates are applied with a voltage, these particles will electrophoretically migrate from the conductive plate on which they are located to the oppositely charged conductive plate. When the particles are located on the front side (display surface) of the display, the display screen is white because the light is scattered back to the reader by the titanium dioxide particles; when the particles are located on the back side of the display, the display screen is black because the colored dye absorbs the incident light. The electrode on the back side is divided into a plurality of minute image elements (pixel electrodes), and an image is formed by applying an appropriate voltage to each pixel electrode of the display to generate a reflection region pattern and an absorption region pattern.

The electrophoresis technology has several advantages. First, the energy consumption is low. Due to the bi-stability, the image is still retained on the display for a few days or months after the power is turned off. Second, the display produced by the electrophoresis technology is reflective-type, so it has good sunlight readability, and can also be combined with front or side light for dark environments. Third, there is potential for low production costs because the technology does not require strict packaging and it is feasible to use solution processing techniques such as printing. Fourth, the electrophoretic display is characterized by a flexible form factor which allows them to be manufactured on plastic, metal or glass surfaces, and thus it is suitable for manufacturing flexible displays.

The electronic paper display has low power consumption and foldable bending function. The picture display is fine and the viewing angle is wide. Compared with other display technologies, the biggest advantages are the good visual effect under the sunlight and no dead angle. However, the electronic paper displays still do not have the same tactile sensation and using effect as real paper.

The disclosure provides a flexible fiber substrate and a flexible display device including the same, which have a tactile sensation and a using effect closer to real paper.

Figure 2:
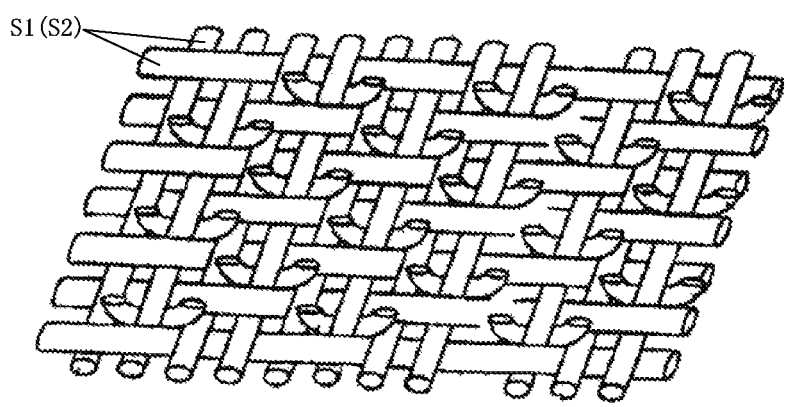
FIG. 2 is a schematic view of weaving of conductive fibers and insulating fibers of a flexible fiber substrate according to an embodiment of the disclosure.

FIG. 1 is a schematic cross-section structure view of a flexible fiber substrate according to an embodiment of the disclosure. FIG. 2 is a schematic view of weaving of conductive fibers and insulating fibers of a flexible fiber substrate according to an embodiment of the disclosure. Referring to FIGS. 1 and 2, an embodiment of the disclosure provides a flexible fiber substrate 1 which is woven from a conductive fiber S1 and an insulating fiber S2. The flexible fiber substrate 1 comprises a patterned conductive member 11 made of the conductive fiber S1 and an insulating body 12 woven from the insulating fiber S2. The conductive member 11 and the insulating body 12 are fixed to each other by interlacing. The conductive member 11 is touchable from outside of the flexible fiber substrate 1.

For example, at least a portion of the conductive member 11 is exposed from the surface of the flexible fiber substrate. The specific form in which the conductive member 11 is exposed from the surface of the flexible fiber substrate is not particularly limited, and will be exemplified in the embodiment described below. For example, at least a portion of the conductive member 11 is exposed from the surface of the flexible fiber substrate so as to be electrically connectable to other conductive members on the flexible fiber substrate 1.

For example, the conductive member 11 and the insulating body 12 integrally form the flexible fiber substrate 1 by weaving, thereby reducing the number of process steps for separately forming wirings on the substrate, so as to save the cost.

Referring to FIG. 1, the flexible fiber substrate 1 has a first outer surface M1 and a second outer surface M2 which are opposite and overlap each other when in a substantially flat state. The first outer surface M1 and the second outer surface M2 are substantially located in a first plane P1 and a second plane P2, respectively. In a direction perpendicular to the flexible fiber substrate 1 in the flat state, the flexible fiber substrate 1 does not exceed beyond any of the first plane P1 and the second plane P2. That is, in the direction perpendicular to the flexible fiber substrate 1 in the flat state, the flexible fiber substrate 1 is completely located between the first plane P1 and the second plane P2 (comprising located on the first plane P1 and the second plane P2). At least a portion of the conductive member 11 is located on at least one of the first outer surface M1 and the second outer surface M2 of the flexible fiber substrate 1. Although in FIG. 1, a portion of the conductive member 11 is located on the first outer surface M1 and there is not any portion of the conductive member on the second outer surface M2, in another example, the conductive member 11 can comprise portions located on the first outer surface M1 and the second outer surface M2, respectively.

For example, the flexible fiber substrate 1 comprises, for example, a plurality of woven layers connected to each other. When the flexible fiber substrate 1 is in the flat state, the plurality of the woven layers overlap each other in the direction perpendicular to the flexible fiber substrate 1. For example, the plurality of the woven layers are bonded to each other by weaving. The plurality of the woven layers comprise a first outermost woven layer 1-1, a second outermost woven layer 1-3, and at least one intermediate woven layer 1-2 between the first outermost woven layer 1-1 and the second outermost woven layer 1-3. In the flexible fiber substrate 1 according to the embodiment shown in FIG. 1, only one intermediate woven layer 1-2 is located between the first outermost woven layer 1-1 and the second outermost woven layer 1-3. It should be appreciated that in the flexible fiber substrate 1 according to another example, a plurality of intermediate woven layers 1-2 are disposed between the first outermost woven layer 1-1 and the second outermost woven layer 1-3. In yet another example, the flexible fiber substrate 1 can comprise only one woven layer. Embodiments of the disclosure do not limit the number of the woven layers comprised in the flexible fiber substrate.

The three woven layers shown in FIG. 1 completely overlap each other, however the embodiments of the disclosure are not limited thereto. In another example, every two of the plurality of the woven layers can partly overlap. For example, in the plan view of the flexible fiber substrate 1, the second outermost woven layer 1-3 is larger than the first outermost woven layer 1-1 and any intermediate woven layer 1-2, and the first outermost woven layer 1-1 and any intermediate woven layer 1-2 are located within the second outermost woven layer 1-3.

FIG. 2 is a schematic view of weaving of conductive fibers and insulating fibers of a flexible fiber substrate according to an embodiment of the disclosure. For example, both of the conductive member 11 and the insulating body 12 of the flexible fiber substrate 1 shown in FIG. 1 have a weaving pattern as shown in FIG. 2, for example. It should be appreciated that FIG. 2 only shows the weaving pattern of a portion of the single woven layer, and embodiments of the disclosure do not limit the weaving pattern of the conductive member 11 and the insulating body 12. In addition, the weaving pattern shown in FIG. 2 is merely exemplary, and the embodiment of the disclosure is not particularly limited thereto, and any suitable weaving pattern can be adopted according to actual requirements. A portion of the single woven layer shown in FIG. 2 can be entirely woven from the insulating fiber S2, or entirely woven from the conductive fiber S1, or can be woven from both of the conductive fiber and the insulating fiber.

As shown in FIG. 1, the conductive member 11 is located in the first outermost woven layer 1-1. When the flexible fiber substrate 1 is in a substantially flat state, its first outer surface M1 is also in the substantially flat state. The conductive member 11 and the insulating body 12 are substantially aligned with the first outer surface M1 of the flexible fiber substrate 1. That is, at least a portion of the conductive member 11 is located on the first outer surface M1 of the flexible fiber substrate 1. Because the conductive member 11 is directly exposed to the first outer surface M1 of the flexible fiber substrate 1, the conductive member 11 is touchable from the outside of the flexible fiber substrate 1.

Figure 3:
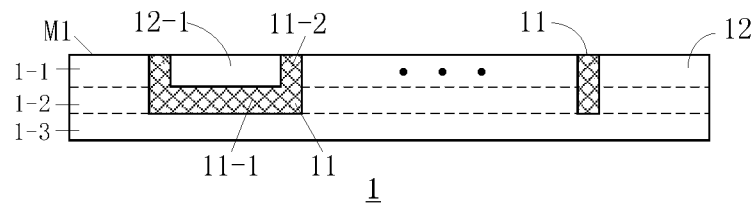
FIG. 3 is a schematic sectional structure view of a flexible fiber substrate according to an embodiment of the disclosure.

In the flexible fiber substrate 1 according another embodiment of the disclosure, referring to FIG. 3, the conductive member 11 comprises a first portion 11-1 located in the intermediate woven layer 1-2 and a second part of 11-2 located in the first outermost woven layer 1-1. The first portion 11-1 and the second portion 11-2 are physically and electrically connected to each other. The second portion 11-2 is exposed to the first outer surface M1 of the flexible fiber substrate 1, and thus the conductive member 11 is touchable from the outside of the flexible fiber substrate 1. A portion 12-1 of the insulating body 12 located in the first outermost woven layer 1-1 and the first portion 11-1 of the conductive member 11 overlap each other.

Figure 4:
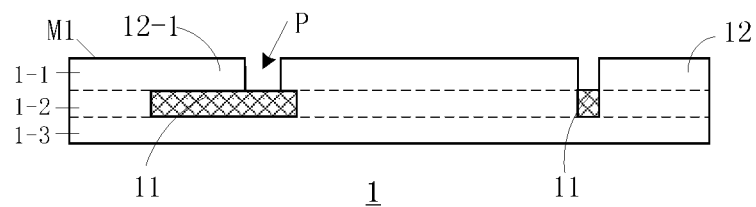
FIG. 4 is a schematic sectional structure view of a flexible fiber substrate according to an embodiment of the disclosure.

In the flexible fiber substrate 1 according to still another embodiment of the disclosure, referring to FIG. 4, the conductive member 11 is located in the intermediate woven layer 1-2. An opening P exposing the conductive member 11 is formed in the insulating body 12. The opening P is located directly above the conductive member 11 and penetrates all the layers between the conductive member 11 and the first outer surface M1 of the flexible fiber substrate 1 to expose the conductive member 11. In the embodiment, the opening P is located in the first outermost woven layer 1-1. Therefore, the conductive member 11 is touchable from the outside of the flexible fiber substrate 1 through the opening P. The portion 12-1 of the insulating body 12 located in the first outermost woven layer 1-1 and the conductive member 11 overlap each other.

The conductive fiber S1 comprises a polymer material and a conductive material dispersed therein. For example, the polymeric material is polyamide. The conductive material is, for example, carbon nanotubes. When the conductive fiber S1 is a fiber of a composite material composed of carbon nanotubes and polyamide, because the carbon nanotube has good conductivity and transparency and the polyamide material has good flexibility, the conductive member 11 formed of the conductive fiber S1 not only has both good electrical conductivity and transparency, but also has good flexibility.

For example, the insulating fiber comprises the polymeric material. Because the polyamide material also has excellent insulating properties, when the polyamide fiber is used as the insulating fiber S2, the insulating body 12 formed of the insulating fiber S2 has good insulation and flexibility.

For example, a diameter of the insulating fiber S2 and a diameter of the conductive fiber S1 are in the range of 80 to 200 μm; further, the diameter of the insulating fiber S2 and the diameter of the conductive fiber S1 are in the range of 90 to 120 μm; still further, the diameter of the insulating fiber S2 and the diameter of the conductive fiber S1 are in the range of 95 to 105 μm.

For example, in the embodiment of the disclosure, the diameter of the insulating fiber S2 is substantially equal to the diameter of the conductive fiber S1.

Embodiments of the disclosure provide a method of manufacturing any of the above flexible fiber substrates. The method comprises: providing an insulating fiber S2; providing a conductive fiber S1; and weaving the insulating fiber S2 and the conductive fiber S1 to form the above flexible fiber substrate 1.

For example, the insulating fiber S2 is a polyamide fiber.

For example, the conductive fiber S1 is a fiber of a composite material composed of carbon nanotubes and polyamide. This step comprises, for example, the following operations:

performing an ultrasonic process on a mixed solution of carbon nanotubes, a polyamide, and an organic solvent by an ultrasonic process chamber, to obtain a solution of a composite material composed of the carbon nanotubes and the polyamide. For example, the organic solvent comprises chloroform, phenol-tetrachloroethane solution, and the like;

rotating a mixed vacuum press to dry the solution of the composite material composed of the carbon nanotubes and the polyamide under vacuum to obtain particles of the composite material composed of the carbon nano-tubes and the polyamide; and adding the particles of the composite to a melt spinning machine or an electrostatic spinning apparatus to form fibers of the composite of the carbon nanotubes and the polyamide.

For example, a loom is adopted, and an intelligent controller is used to control the warp tension of the loom to improve the uniformity of the warp and weft density of the insulating fiber S2 and the conductive fiber S1 woven into the flexible fiber substrate. For example, in the weaving process, it is possible to reasonably control the blending of the polyamide fibers and the conductive fibers containing the carbon nanotubes.

One skilled in the art can implement the pattern of the conductive member 11 in the insulating body 12 by using a weaving method known in the art. For example, after a plurality of woven layers are formed by weaving the insulating fibers, the conductive fibers are interposed in at least the outermost woven layer.

In the above embodiment, the insulating fiber S2 and the conductive fiber S1 are both man-made materials. When the flexible fiber substrate is woven by the insulating fiber S2 and the conductive fiber S1, the warp and weft density is easily controlled, and thus the uniformity of the warp and weft density of the produced fiber flexible substrate is high. Further, the flexible fiber substrate woven by the insulating fiber S2 and the conductive fiber S1 is not easily broken, and has a touch feeling closer to real paper. Therefore, the flexible fiber substrate according to the embodiment of the disclosure is suitable for use as a base substrate of a flexible display device.

Figure 5:
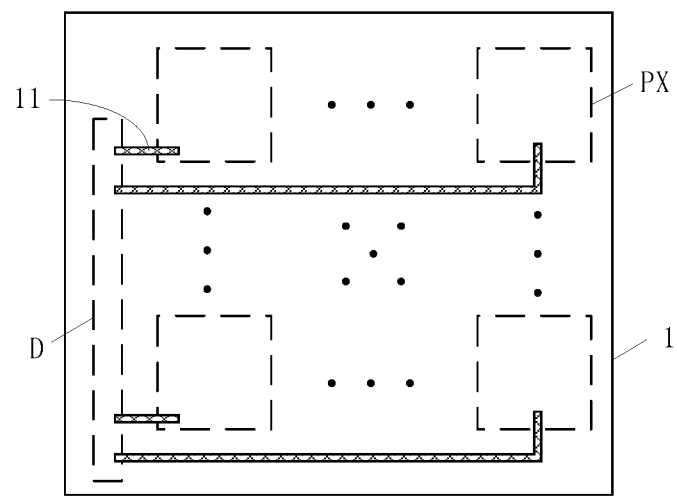
FIG. 5 is a schematic plan structure view of a flexible fiber substrate according to an embodiment of the disclosure.

FIG. 5 is a schematic plan structure view of a flexible fiber substrate 1 according to an embodiment of the disclosure. The flexible fiber substrate 1 shown in FIG. 5 is used, for example, as a base substrate of a flexible display device, and the conductive member 11 in the flexible fiber substrate 1 is configured to provide a display driving signal to the pixel unit PX of the flexible display device. For example, the conductive member 11 is electrically connected to the driving chip D and the pixel electrodes in the pixel unit PX.

Figure 6:
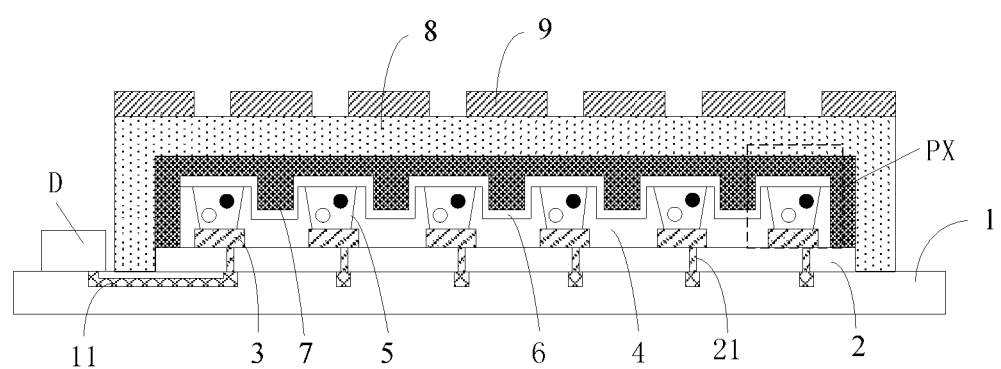
FIG. 6 is a schematic sectional structure view of a flexible display device according to an embodiment of the disclosure.

An embodiment of the disclosure provides a flexible display device 100, referring to FIG. 6, comprising: the flexible fiber substrate 1 according to any of the above embodiments, and a plurality of pixel units PX on the flexible fiber substrate 1. Each of the pixel units PX comprises, for example, a pixel electrode 3 and a common electrode 7 for displaying an image. At least one of the pixel electrode 3 and the common electrode 7 is electrically connected to the conductive member 11 of the flexible fiber substrate 1.

For example, the pixel unit PX is an electrophoretic microcapsule pixel unit. Referring to FIG. 6, an electrophoretic microcapsule 5 between the pixel electrode 3 and the common electrode 7 is further comprised in each of the pixel units PX. The charged particles in the respective electrophoresis microcapsules 5 are driven by an electric field between the pixel electrode 3 and the common electrode 7 so as to move between the pixel electrode 3 and the common electrode 7 to display an image.

The electrophoresis microcapsule 5 has, for example, a trapezoidal sectional shape. The short base of the trapezoid is closer to the flexible fiber substrate relative to the long base. In this way, the aperture ratio of the flexible display device 100 can be improved. Here, the shape of the electrophoretic microcapsule 5 is defined, for example, by the photoresist layer 4 and the resin encapsulation layer 6. For example, the resin encapsulating layer 6 has a square wave sectional shape.

Referring to FIG. 6, the flexible display device 100 further comprises an insulating layer 2 between the pixel electrode 3 and the flexible fiber substrate 1. A first through hole 21 is located in the insulating layer 2. The pixel electrode 3 is electrically connected to the conductive member 11 of the flexible fiber substrate 1 via the first through hole 21 in the insulating layer 2. The conductive member 11 is electrically connected to the driving chip D and the pixel electrode 3 to transmit a display driving signal to the pixel electrode 3.

For example, the common electrode 7 can also be electrically connected to another conductive member 11 of the flexible fiber substrate 1 through a second through hole (not shown) in the insulating layer 2.

It is to be appreciated that the embodiment of the disclosure does not limit the type and number of display electrodes electrically connected to the conductive member 11 of the flexible fiber substrate 1, provided that the display electrode is for controlling image display of the flexible display device 100.

Further, in another example, the first through hole for electrically connecting the pixel electrode 3 and the conductive member 11 of the flexible fiber substrate 1 and the second through hole for electrically connecting the common electrode 7 and the conductive member 11 of the flexible fiber substrate 1 can pass through different insulating layers.

Continuing referring to FIG. 6, the insulating layer 2 is a planarization layer having a planar surface far away from the flexible fiber substrate 1. The planar surface is flatter than the surface of the flexible fiber substrate facing the pixel unit PX. Thus, the pixel unit PX formed on the planarization layer 2 can have a smoother and more uniform structure.

For example, the insulating layer 2 is a pale yellow polyimide layer. In this way, it is possible to provide a display effect that is more suitable for human eyes.

For example, the common electrode layer is a nano-silver common electrode, an ITO electrode, or other high light flux electrode.

The flexible fiber substrate according to the embodiment of the disclosure is used as a base substrate of a flexible electronic paper display device, and in case of being largely blended, the orientation direction of the electrophoretic microcapsules being uniform can be achieved, thereby improving the contrast and image quality of the electrophoretic display device. Further, the conductive member formed in the flexible fiber substrate can be configured to provide a control signal to a pixel unit in the display device. Because the conductive members are also formed at the same time as the flexible fiber substrate is formed, the step of separately foil ling the conductive members can be saved, thereby simplifying the manufacturing process.

It can be appreciated that the insulating layer 2 is not necessary in the above embodiments. For example, when the flexible fiber substrate 1 in the embodiment shown in FIG. 3 or FIG. 4 is used as the base substrate of the flexible display device 100, the portion 12-1 of the insulating body 12 which is located in the first outmost woven layer 11 and overlap the conductive member 11 can serve as an insulating layer for isolating the conductive member 11 and the display electrode (for example, the pixel electrode 3).

An embodiment of the disclosure provides a method of manufacturing the above flexible display device, comprising following steps:

providing a base substrate 1 which is, for example, a flexible fiber substrate according to any of the above embodiments of the disclosure;

forming a planarization layer 2 on the base substrate 1;

forming a through hole 21 in the planarization layer 2;

forming a patterned pixel electrode 3 on the planarization layer 2, wherein the pixel electrode 3 is electrically connected to the conductive member 11 in the flexible fiber substrate 1 via the through hole 21 in the planarization layer 2; the conductive member 11 is electrically connected to the driving chip D and the pixel electrode 3 to transmit the display driving signal to the pixel electrode 3;

forming a patterned photoresist layer 4 on the pixel electrode 3, the photoresist layer 4 having a plurality of recesses arranged in an array for accommodating electronic ink;

depositing an electronic ink layer into a plurality of recesses of the photoresist layer 4 by using, for example, an inkjet printing technique to form a plurality of electrophoretic microcapsules 5;

coating a resin encapsulating layer 6 on the plurality of the electrophoretic microcapsules 5 to package respective electrophoretic microcapsules;

forming a common electrode 7 on the resin encapsulation layer 6, for example, forming a nano-silver common electrode by an inkjet printing method; or forming an ITO electrode or other high luminous flux electrode as a common electrode by deposition;

forming a sealant layer 8 on the common electrode 7; and forming a touch electrode layer 9 on the sealant layer 8.

Although the flexible display device of the above embodiment is an electronic paper flexible display device, the embodiment of the disclosure is not limited thereto. The flexible display device according to another embodiment can be an organic light emitting flexible display device. The display electrode of the organic light-emitting flexible display device comprises, for example, an anode and a cathode of an organic light emitting diode.

What are described above is related to the illustrative embodiments of the disclosure only and not limitative to the scope of the disclosure; the scopes of the disclosure are defined by the accompanying claims.

The invention claimed is:

1. A flexible display device comprising:
a flexible fiber substrate, wherein the flexible fiber substrate comprises:
an insulating body woven from an insulating fiber and a patterned conductive member made of a conductive fiber, wherein the conductive member and the insulating body are fixed to each other by interlacing, and the conductive member is touchable from outside of the flexible fiber substrate;
a plurality of woven layers connected to each other and at least partially overlapping each other, the plurality of woven layers comprises a first outermost woven layer, a second outermost woven layer and at least one intermediate woven layer between the first outermost woven layer and the second outermost woven layer,
the conductive member comprises a first portion located in the at least one intermediate woven layer, and a portion of the insulating body located in the first outermost woven layer overlaps the first portion of the conductive member;
a pixel unit on the flexible fiber substrate, comprising a display electrode for displaying an image,
wherein the display electrode is electrically connected to the conductive member of the flexible fiber substrate, wherein the pixel unit is a pixel unit comprising an electrophoretic microcapsule, and the electrophoretic microcapsule has a sectional shape of a trapezoid, and a short base of the trapezoid is closer to the flexible fiber substrate relative to a long base of the trapezoid.

2. The flexible display device according to claim 1, wherein the display electrode comprises at least one of a pixel electrode and a common electrode.

3. The flexible display device according to claim 1, wherein the flexible display device further comprises an insulating layer between the display electrode and the flexible fiber substrate, a through hole is located in the insulating layer, and the display electrode is electrically connected to the conductive member of the flexible fiber substrate via the through hole in the insulating layer.

4. The flexible display device according to claim 3, wherein the insulating layer is a planarization layer having a planar surface far away from the flexible fiber substrate.

5. The flexible display device according to claim 4, wherein the planarization layer is a polyimide layer.

6. The flexible display device according to claim 1, wherein the display electrode is a pixel electrode,
the flexible display device further comprises an insulating layer between the display electrode and the flexible fiber substrate, a through hole being located in the insulating layer, the display electrode being electrically connected to the conductive member of the flexible fiber substrate via the through hole in the insulating layer, and the display electrode being located between the insulating layer and the electrophoretic microcapsule.

7. The flexible display device according to claim 1, wherein at least a portion of the conductive member is exposed from a surface of the flexible fiber substrate.

8. The flexible display device according to claim 1, wherein the flexible fiber substrate has a first outer surface and a second outer surface which are opposite and overlap each other upon being in a substantially flat state, the first outer surface and the second outer surface are substantially located in a first plane and a second plane, respectively; the flexible fiber substrate does not exceed beyond the first plane and the second plane in a direction perpendicular to the flexible fiber substrate in the flat state, at least a portion of the conductive member is located on at least one of the first outer surface and the second outer surface of the flexible fiber substrate.

9. The flexible display device according to claim 1, further comprising,
a plurality of woven layers connected to each other and at least partially overlapping each other, the plurality of woven layers comprises a first outermost woven layer, a second outermost woven layer and at least one intermediate woven layer between the first outermost woven layer and the second outermost woven layer;

wherein the conductive member comprises a first portion located in the at least one intermediate woven layer, and a portion of the insulating body located in the first outermost woven layer overlaps the first portion of the conductive member.

10. The flexible display device according to claim 9, wherein the first outermost woven layer has an opening, and the first portion of the conductive member is touchable from the outside of the flexible fiber substrate through the opening.

11. The flexible display device according to claim 9, wherein the conductive member further comprises a second portion located in the first outermost woven layer, and the second portion of the conductive member is electrically connected to the first portion.

12. The flexible display device according to claim 11, wherein the conductive fiber comprises a polymeric material and a conductive material dispersed therein.

13. The flexible display device according to claim 12, wherein the insulating fiber comprises the polymeric material.

14. The flexible display device according to claim 12, wherein the polymeric material comprises polyamide.

15. The flexible display device according to claim 12, wherein the conductive material comprises carbon nanotubes.

16. The flexible display device according to claim 11, wherein a diameter of the insulating fiber is substantially equal to a diameter of the conductive fiber.

17. The flexible display device according to claim 11, wherein the flexible fiber substrate is configured as a base substrate of a flexible display device, the flexible display device further comprises a display electrode on the base substrate, the conductive member is configured to electrically connect to the display electrode.

* * * * *